United States Patent [19]

Komatsu et al.

[11] Patent Number: 5,173,875
[45] Date of Patent: Dec. 22, 1992

[54] SEMICONDUCTOR MEMORY DEVICE

[75] Inventors: Kenji Komatsu, Tokyo; Teruyuki Hiyoshi, Yokohama; Tohru Yoshikawa, Sagamihara; Kaoru Nakagawa, Kawasaki, all of Japan

[73] Assignee: Kabushiki Kaisha Toshiba, Kawasaki, Japan

[21] Appl. No.: 610,587

[22] Filed: Nov. 8, 1990

[30] Foreign Application Priority Data

Nov. 10, 1989 [JP] Japan ................................ 1-292996

[51] Int. Cl.$^5$ .............................................. G11C 13/00
[52] U.S. Cl. .......................... 365/189.01; 365/230.08; 365/226
[58] Field of Search ...................... 365/189.01, 230.01, 365/226, 227, 189.05, 230.08

[56] References Cited

U.S. PATENT DOCUMENTS 5,045,726  9/1991  Leung .................. 365/189.01

Primary Examiner—Terrell W. Fears
Attorney, Agent, or Firm—Foley & Lardner

[57] ABSTRACT

There is enclosed a semiconductor memory device having an internal circuit including a plurality of memory cells which can store data thereinto, respectively, to output, as a first output signal, data in a memory cell selected by an address signal, and an output circuit adapted to receive the first output signal to output a second output signal. Power from the same external power supply is delivered to the internal circuit and the output circuit through power supply terminals, and power supply wirings. The power is delivered to the internal circuit through a resistor formed in the middle of the power supply wirings.

10 Claims, 3 Drawing Sheets

Н,173,875

SEMICONDUCTOR MEMORY DEVICE

FIELD OF THE INVENTION

This invention relates to a semiconductor memory device, and more particularly to a semiconductor memory device adapted to output signals from an internal circuit, e.g., a memory cell, etc. to the external through an output circuit.

BACKGROUND OF THE INVENTION

To meet market demands for a great quantity of semiconductor integrated circuits, these circuits are continuously being improved. Take an example of a semiconductor memory. There are various systems of diverse natures, e.g., personal computers, transmitters, TVs, or VTRs., etc., in addition to the main memory units of computers using semiconductor memories.

To meet the requirements of miniaturization, lightness in weight and low power dissipation in these systems, it is required to replace a section where four memories of 64k×4 bits were used until now by a single memory of 64k×16 bits. For this reason, demand for memories of large capacity and of the multi-bit type is increasing.

In such semiconductor integrated circuits, there are many instances where a current at the time of output increases in proportion to the number of output circuits (output buffers), resulting in a great change (hereinafter referred to as an output noise) in both the power supply potential and the ground potential. Accordingly, in semiconductor integrated circuits where power supply wirings of the output circuit and the internal circuit are commonly used, the internal circuit would be directly affected by the output noise. There is a significant possibility that some erroneous operation in the circuit may take place. As a typical measure to cope with this possibility, there is proposed means to independently provide a power supply wiring for the output circuit, or the like.

FIG. 1 is a block diagram of a semiconductor integrated circuit (semiconductor memory) of the background art wherein respective power supply wirings for the internal circuit and the output circuit are independently provided. This block diagram shows an equivalent circuit of a chip mounted in a package.

In FIG. 1, on the semiconductor chip A, an internal circuit B including an input circuit and an output circuit C are provided. The internal circuit B includes, in addition to the input circuit, other circuits of the semiconductor memory except for the output circuit, e.g., a memory cell array including a plurality of memory cells, a sense amplifier SA, and the like. Storage data in one selected memory cell MC is outputted from the cell through the output circuit C. Power supply pads (power supply terminals) 5 to 8 are provided on the chip. These pads 5 to 8 are connected to the circuits B and C by way of wirings 1 to 4, respectively. The input sides of these pads 5 to 8 are connected to external power supplies $V_{cc}$ and $V_{ss}$ through wirings 101 to 104. These wirings 101 to 104 include all the wirings from the external power supplies $V_{cc}$ and $V_{ss}$ up to the pads 5 to 8, for example, include inner leads of the package, bonding wires, and the like.

When this device is used, an external pass capacitor $C_{pass}$ is ordinarily connected between these power supplies $V_{cc}$ and $V_{ss}$. Furthermore, a capacitor $C_{chip}$ of the chip body is used in the internal circuit B. This capacitor $C_{chip}$ (through a substrate or the like) is wired between power supplies $V_{cc}$ and $V_{ss}$ in the chip. In this example, the elements connected on the output side of the output circuit C are artificially indicated by an output load $C_{out}$ and resistors $R_1$ and $R_2$ connected in series between the power supply $V_{cc}$ and the ground GND.

The semiconductor integrated circuit of the background art in which the power supply wiring is separated by the internal circuit. The output circuit is constructed as shown in FIG. 1. However, this circuit has the drawbacks described below. Namely, when the output circuit operates, since charges are delivered from the capacitor $C_{chip}$ via a path including the pad 6, the wiring 2, the wiring 1, and the pad 5, an internal current path is formed within the chip. For this reason, the influence of output noise appears on the power supply wiring for the internal circuit, so it is exerted on the internal circuit B. This phenomenon is accelerated by multi-bit or high speed implementation. For this reason, even if the power supply wiring is simply separated as described above, it is difficult to sufficiently suppress output noise.

SUMMARY OF THE INVENTION

With the above in view, this invention has been made, and its object is to provide a semiconductor memory device constructed so that the influence of noise on the internal circuit can be suppressed as much as possible.

This invention provides a semiconductor memory device comprising an internal circuit (B), including a plurality of memory cells (MC) which can store data, respectively, to output, as a first output signal, data in a memory cell (MC) selected by an address signal, and an output circuit (C) adapted to receive the first output signal to output a second output signal corresponding thereto to the external output, power from the same external power supply ($V_{cc}$, $V_{ss}$) being delivered to the internal circuit (B) and the output circuit (C) through power supply terminals (5 to 8, 13, and 14), and power supply wirings (1 to 4, 11A, 11B, 12A and 12B), the power being delivered to the internal circuit (B) through a resistor ($R_x$) formed in the middle of the power supply wiring.

DESCRIPTION OF THE PREFERRED EMBODIMENTS

Figure 1:
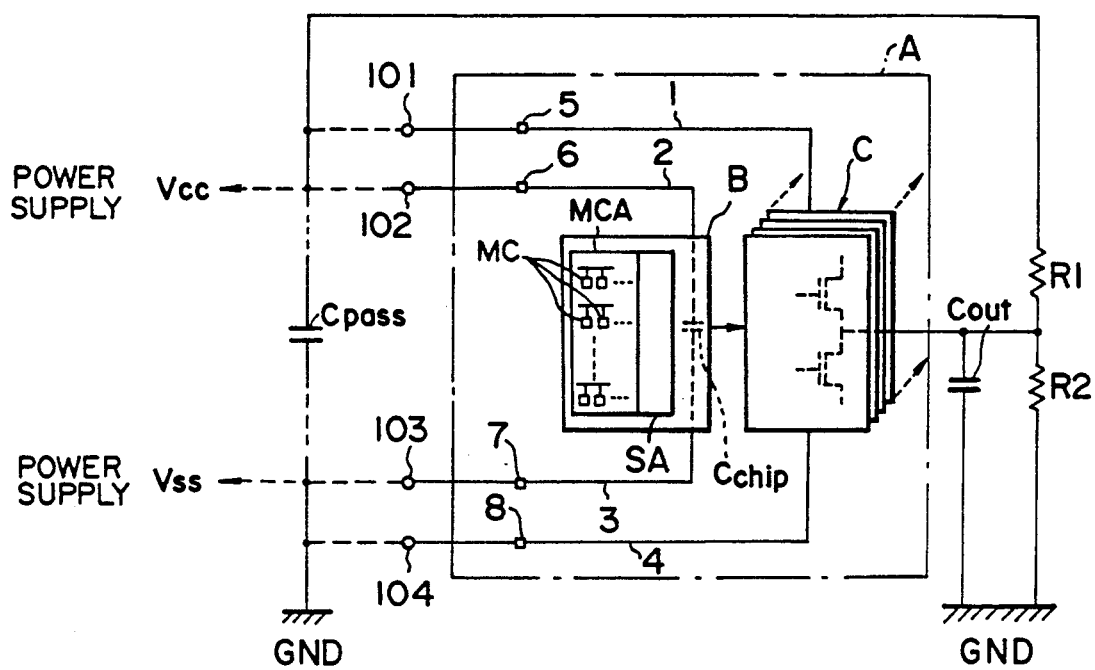
FIG. 1 is an equivalent circuit diagram of an embodiment of the background art.
Figure 2:
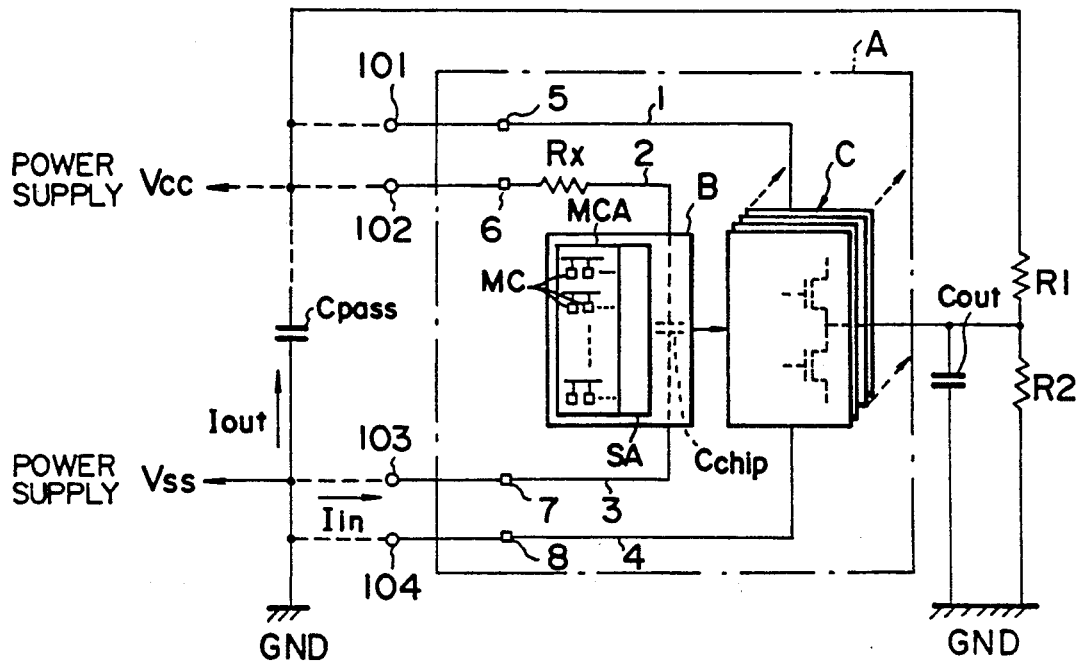
FIG. 2 is an equivalent circuit diagram of an embodiment according to this invention.

FIG. 2 shows an equivalent circuit of an embodiment of this invention. In FIG. 2, the same reference numerals as those of FIG. 1 are given to components identical to those of FIG. 1, respectively. The embodiment shown in FIG. 2 differs from the embodiment shown in FIG. 1 in that a resistor $R_x$ is connected in series between the pad 6 and the circuit B, i.e., in a current path to the internal circuit B. Other components are substantially the same as those of the circuit of FIG. 1.

The operation of the circuit of FIG. 2 will now be described. As described above, the reason why the influence of output noise is exerted on the internal circuit B is that an internal current path is formed in the chip through the capacitor $C_{chip}$ of the chip body. Accordingly, if a measure is taken to make such an internal current path difficult to form, then it becomes difficult to impose output noise on the internal circuit. The embodiment of this invention is constructed so that it operates as stated above. Namely, since the resistor $R_x$ is connected in series in the internal current path, the impedance of this path increases. In contrast, the impedance of an external current path including the external pass capacitor $C_{pass}$ is lowered relatively. For this reason, a current which passes through the external pass capacitor $C_{pass}$ of the charge/discharge current increases, whereas a current which passes through the capacitor $C_{chip}$ of the chip body decreases. Thus, the influence on the internal circuit B of output noise is relaxed.

Figure 4A:
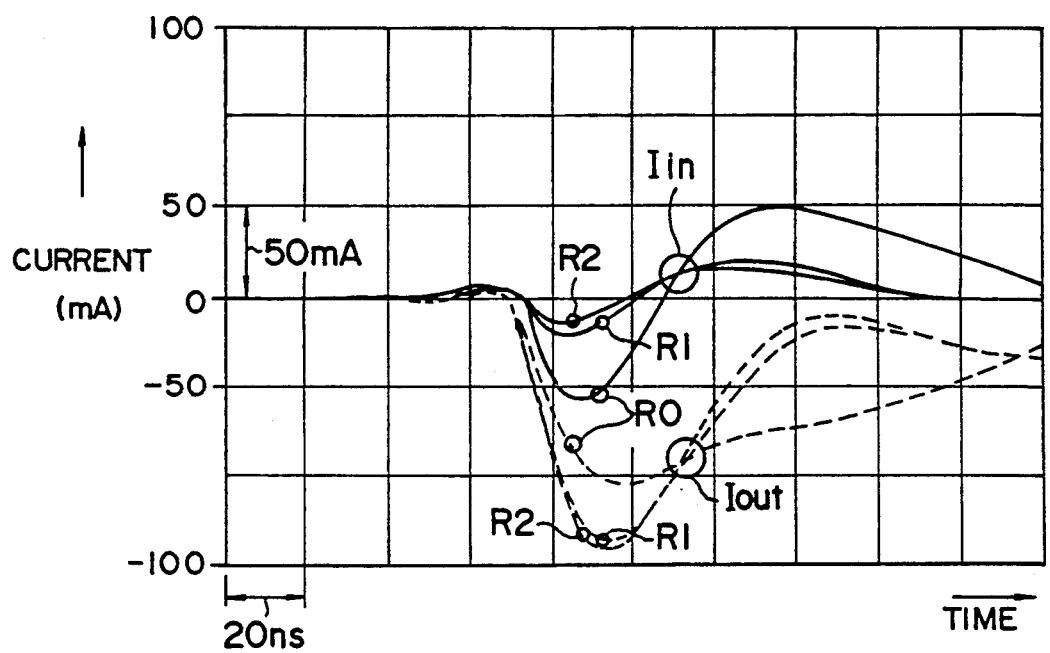
FIGS. 4A and 4B are diagrams showing the experimental results carried out in confirmation of the effects and advantages of this invention.
Figure 4B:
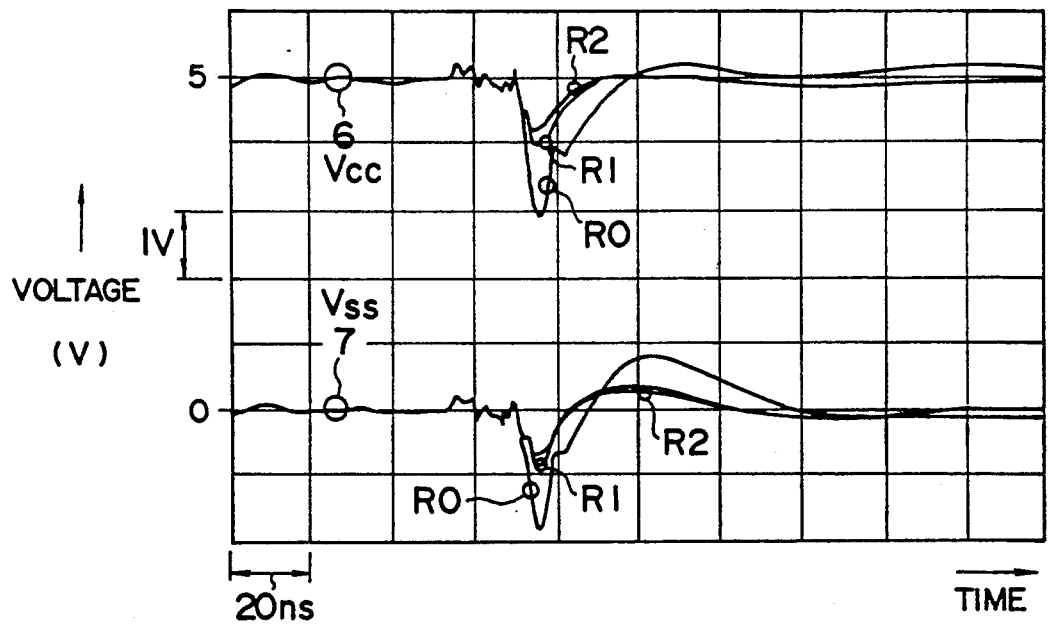

FIGS. 4A and 4B show the experimental results for confirmation of effects and/or advantages with the embodiment of this invention. FIG. 4A is a waveform diagram of currents $I_{in}$ and $I_{out}$ flowing in the internal (capacitor $C_{chip}$) and the external (capacitor $C_{pass}$) of the chip, respectively. FIG. 4B is a waveform diagram of voltages (power supply voltages $V_{cc}$, $V_{ss}$) of pads 6 and 7. In these figures, R0 to R2 indicate waveforms in the case where the value of the resistor $R_x$ is increased from zero stepwise, i.e., in two stages. Namely, R0 shows a waveform when the resistance of resistor $R_x$ is equal to zero. This eventually represents the waveform in the conventional case of FIG. 1 where there is no resistor $R_x$. It is readily seen from FIG. 4A that insertion of the resistor $R_x$ decreases the current $I_{in}$ flowing in the internal current path, and increases a current $I_{out}$ flowing in the external current path. It is seen from the indication of a decrease in voltage changes on $V_{cc}$ line and $V_{ss}$ line that a desired object is achieved by changing the currents $I_{in}$ and $I_{out}$ flowing in the internal and external paths, so they increase and decrease as stated above, respectively.

Attention is now drawn to R0 of $V_{cc}$ and $V_{ss}$ of FIG. 4B. The reference voltage of the power supply voltage $V_{cc}$ is assumed to be 5 volts. Both pads 6 and 7 ($V_{cc}$ line, $V_{ss}$ line) indicate large noise amplitudes of about 2 volts, respectively. In the case where the reference voltage is 5 volts, it is apparent that such a reduction in the level of 2 volts would result in an erroneous operation in the circuit. Furthermore, if attention is drawn to the $V_{ss}$ line 7, this line is once level-down, and is then level-up by about 1 volt. In accordance with an increase in the level, a high level input voltage is lowered on the adjacent input terminal by an increased voltage on the $V_{ss}$ line 7. For this reason, a margin of a high level input voltage is not ensured, leading to erroneous operation in the input circuit.

In contrast, the effect resulting from the fact that the resistor $R_x$ is inserted into the internal current path can be seen from R1 and R2 of FIG. 4B. Namely, it is seen that a reduction in the level of R1 and R2 is equal to a value of less than one half of that in the conventional case of R0, and that an increase in the level of R1 and R2 is equal to a value of less than one third of that in the conventional case of R0.

Figure 3:
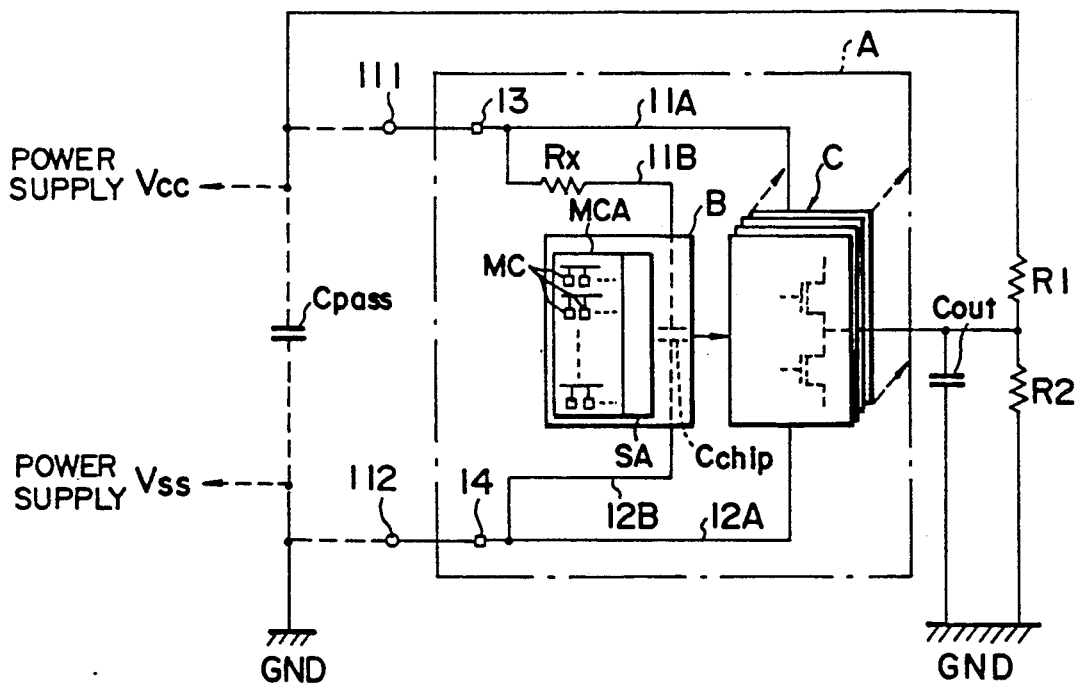
FIG. 3 is an equivalent circuit diagram of a different embodiment according to this invention.

FIG. 3 shows another embodiment of this invention. The embodiment shown in FIG. 3 differs from the embodiment shown in FIG. 2 only in the manner of power supply wiring in the chip A. Namely, in the chip A of FIG. 3, pads 13 and 14 are connected to power supplies $V_{cc}$ and $V_{ss}$, respectively, and the internal circuit B and the output circuit C are connected in parallel with these pads 13 and 14 through wirings 11A, 11B, 12A and 12B. Furthermore, the pad 13 and the internal circuit B are connected through the resistor $R_x$. In FIG. 3, reference numerals 111 and 112 represent wirings on the input side, respectively.

Also with the embodiment of such a configuration, the same effects and/or advantages as those of FIG. 2 can be provided.

What is claimed is:

1. A semiconductor memory device comprising:
an internal circuit including a plurality of memory cells which can store data respectively, to output, as a first output signal, data in a memory cell selected by an address signal, and
an output circuit adapted to receive said first output signal to produce a second output signal corresponding to the external output,
power from the same external power supply being delivered to said internal circuit and said output circuit through power supply terminals, and power supply wirings, said power being delivered to said internal circuit through a resistor formed in the middle of said power supply wirings.

2. A device as set forth in claim 1, wherein the power from said external power supply is directly delivered to said output circuit through said power supply wiring.

3. A device as set forth in claim 1, wherein said output circuit includes a buffer circuit.

4. A device as set forth in claim 1, wherein said power supply terminal includes first separate power supply terminals for delivering power to said output circuit, and second separate power supply terminals for delivering power to said internal circuit, said power supply wiring including first separate power supply wirings for connecting said first power supply terminals and said output circuit, and second separate power supply wirings for connecting said second power supply terminals and said internal circuit.

5. A device as set forth in claim 1, wherein said power supply wiring include first power supply wirings for connecting said power supply terminals and said output circuit, which are branched from said power supply terminals, respectively, and second power supply wirings for connecting said power supply terminals and said internal circuit.

6. A device as set forth in claim 1, wherein said power supply terminal includes high voltage side power supply terminals connected to a high voltage side of said external power supply, and low voltage side power supply terminals connected to a low voltage side of said external power supply, said power supply wiring including high voltage side power supply wirings for connecting said high voltage side power supply terminals to said output circuit and said internal circuit, respectively, and low voltage side power supply wirings for connecting said low voltage side power supply terminals to said output circuit and said internal circuit, respectively.

7. A device as set forth in claim 1, wherein said power supply terminal includes high voltage side power supply terminal connected to a high voltage side of said external power supply, and low voltage side power supply terminal connected to a low voltage side of said external power supply, said power supply wiring including high voltage side power supply wirings for connecting said high voltage side power supply terminal to said output circuit and said internal circuit, and low voltage side power supply wirings for connecting said low voltage side power supply terminal to said output circuit and said internal circuit.

8. A device as set forth in claim 1, wherein said internal circuit and said output circuit are formed in the same semiconductor chip, each of said power supply terminals including a conductive pad formed on said chip.

9. A device as set forth in claim 4, wherein said internal circuit and said output circuit are formed in the same semiconductor chip, said first and second power supply wirings being formed on said chip, each of said first and second power supply terminals including a conductive pad formed on said chip.

10. A device as set forth in claim 5, wherein said internal circuit and said output circuit are formed in the same semiconductor chip, said first and second power supply wirings being formed on said chip, each of said power supply terminals including a conductive pad formed on said chip.

* * * * *